United States Patent [19]

Boston et al.

[11] Patent Number: 4,656,418
[45] Date of Patent: Apr. 7, 1987

[54] MOLDED CLAMP-TYPE AMMETER PROBE

[75] Inventors: John T. Boston, Wauwatosa; Larry D. Pacetti, Kenosha, both of Wis.

[73] Assignee: Snap-on Tools Corporation, Kenosha, Wis.

[21] Appl. No.: 822,789

[22] Filed: Jan. 27, 1986

[51] Int. Cl.⁴ ............................................. G01R 19/15
[52] U.S. Cl. ....................................................... 324/127
[58] Field of Search ........................ 324/128, 129, 149; 336/84 C, 175, 176

[56] References Cited

U.S. PATENT DOCUMENTS

| | | | |
|---|---|---|---|
| 2,663,845 | 12/1953 | Koch . | |
| 3,199,026 | 8/1965 | Leibowitz | 324/127 |
| 3,323,056 | 5/1967 | Haley | 324/127 |
| 3,517,361 | 6/1970 | Reifel et al. | 336/84 C |
| 3,611,136 | 10/1971 | Ito . | |
| 3,706,032 | 12/1972 | Vikstrom | 324/127 |
| 4,005,380 | 1/1977 | Heilmann et al. | 336/176 |
| 4,176,334 | 11/1979 | Buritz et al. | 336/84 C |
| 4,234,846 | 11/1980 | Maringer | 324/127 |
| 4,283,677 | 8/1981 | Niwa . | |
| 4,316,142 | 2/1982 | Kuramoto . | |
| 4,378,525 | 3/1983 | Burdick | 324/127 |
| 4,518,913 | 5/1985 | Jackson . | |

Primary Examiner—Reinhard J. Eisenzopf
Assistant Examiner—William Burns
Attorney, Agent, or Firm—Emrich & Dithmar

[57] ABSTRACT

A clamp-type ammeter probe includes two opposed jaws interconnected for pivotal movement between open and closed conditions and biased to the closed condition, with each of the jaws being of unitary one-piece molded construction. Each jaw includes a magnetic core unit comprising a core segment molded to a spacer segment and fitted within a channel-shaped shield segment to form a unit which is then molded between an outer shell and an inner segment of the jaw for encompassing the core unit except for exposed end portions thereof. These exposed portions on one jaw mate with those on the other jaw when the jaws are closed so that the core segments form a magnetic loop to encircle an associated conductor while the shield segments form a shield path encompassing the core loop. Stop surfaces on the inner segments provide a gap in the core loop in which a magnetic sensor is disposed. Guide surfaces control movement of the jaws to their closed condition to provide repeatable accurate alignment of the exposed portions of the core and shield segments to provide proper mating thereof.

14 Claims, 7 Drawing Figures

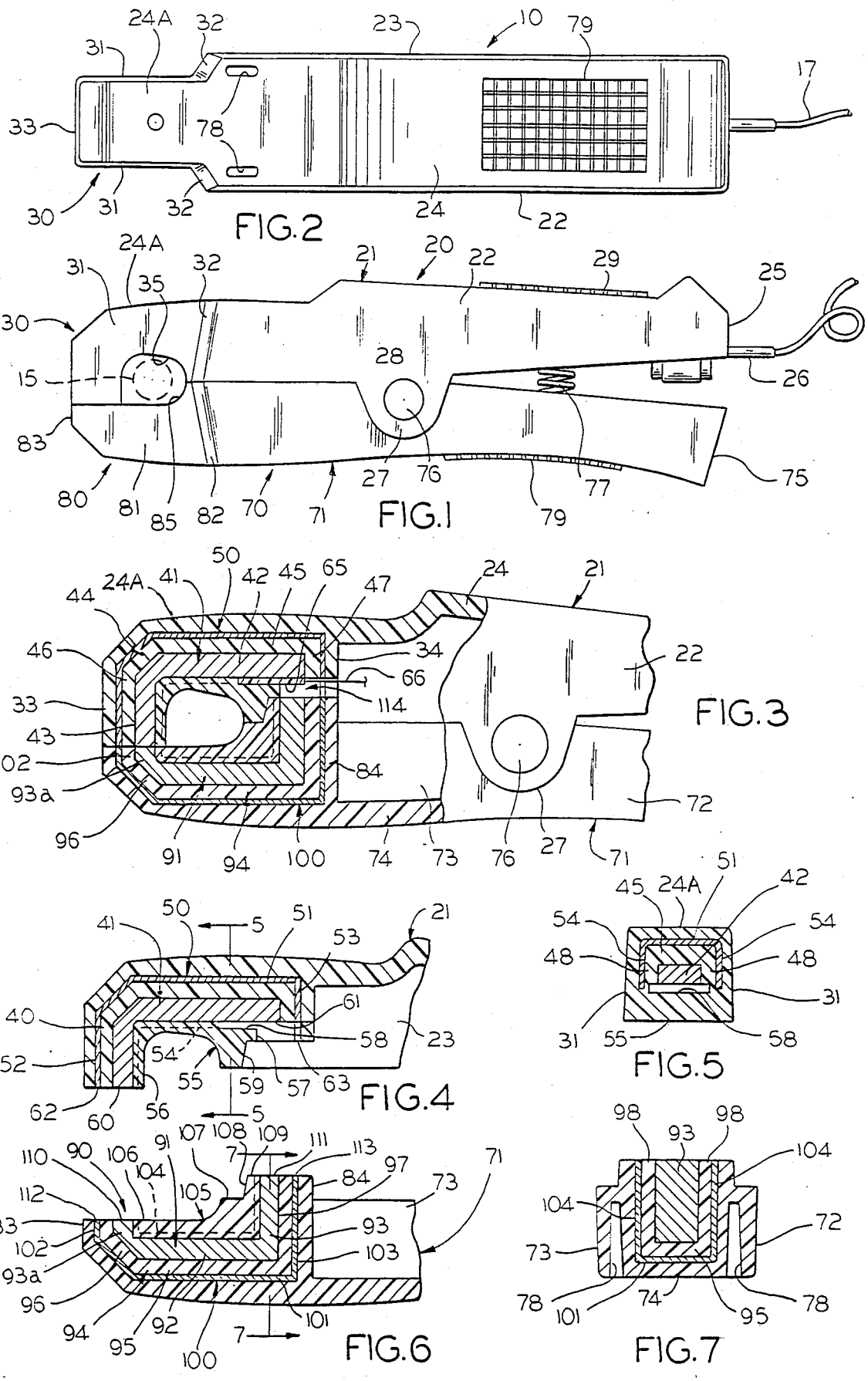

MOLDED CLAMP-TYPE AMMETER PROBE

BACKGROUND OF THE INVENTION

The present invention relates to measuring probes and, in particular, to clamp-type ammeter probes.

Clamp-type ammeter probes comprise a pair of opposed jaws which cooperate in use to form a magnetic circuit around a conductor in order to obtain a signal related to the magnitude of the electric current flowing in the conductor, without interrupting or otherwise affecting the current flow in the conductor. In such clamp-type probes it is important that the opening and closing operations of the jaws proceed smoothly. Each jaw carries a magnetic core segment which cooperate to form the magnetic circuit, and it is important that they move precisely into the proper positions with respect to each other in the closed condition of the jaws.

A problem with prior clamp-type ammeter probes is that they have failed to provide an accurate mating of the magnetic core segments in a simple and effective manner. Furthermore, prior devices have comprised assemblies of numerous parts and, through repeated use, or through mechanical shocks experienced during use, the parts may become loose and misaligned. This prevents such prior devices from effectively maintaining an accurately repeatable magnetic circuit, necessitating frequent calibrations of the device.

SUMMARY OF THE INVENTION

It is a general object of the present invention to provide an improved clamp-type ammeter probe which avoids the disadvantages of prior devices while affording additional structural and operating advantages.

An important object of the invention is the provision of a clamp-type ammeter probe which is of simple and economical construction.

In connection with the foregoing object, it is another object of the invention to provide a clamp-type ammeter probe of the type set forth, which affords accurately repeatable formation of the magnetic circuit.

Still another object of the invention is the provision of a probe of the type set forth, which does not require frequent calibrations.

In connection with the foregoing objects, it is yet another object of the invention to provide a probe of the type set forth, which provides effective magnetic shielding against spurious magnetic fields.

These and other objects of the invention are attained by providing a clamping ammeter probe comprising: two opposed jaws interconnected for pivotal movement between open and closed conditions, each of the jaws including a magnetic core segment disposed between substantially magnetically impermeable segments and unitary with each, the substantially magnetically impermeable segments of each jaw substantially encompassing the associated core segment except for two spaced-apart exposed surface portions thereof, the core segments cooperating to form a magnetic path for encircling an associated conductor with the exposed surface portions of one core segment being respectively disposed in facing relationship with the exposed surface portions of the other core segment when the jaws are disposed in the closed condition thereof.

The invention consists of certain novel features and a combination of parts hereinafter fully described, illustrated in the accompanying drawings, and particularly pointed out in the appended claims, it being understood that various changes in the details may be made without departing from the spirit, or sacrificing any of the advantages of the present invention.

BRIEF DESCRIPTION OF THE DRAWINGS

For the purpose of facilitating an understanding of the invention, there is illustrated in the accompanying drawings a preferred embodiment thereof, from an inspection of which, when considered in connection with the following description, the invention, its construction and operation, and many of its advantages should be readily understood and appreciated.

FIG. 1 is a side elevational view of a clamp-type ammeter probe, constructed in accordance with and embodying the features of the present invention, and illustrated in its use position relative to an associated conductor;

FIG. 2 is a bottom plan view of the ammeter probe of FIG. 1;

FIG. 3 is a enlarged fragmentary view of the tip portion of the probe of FIG. 1, in partial vertical section;

FIG. 4 is a fragmentary sectional view, similar to FIG. 3, of the upper jaw member of the clamp-type probe;

FIG. 5 is a view in vertical section taken along the line 5—5 in FIG. 4;

FIG. 6 is a fragmentary sectional view, similar to FIG. 3, of the lower jaw member of the probe of FIG. 3; and FIG. 7 is a view in vertical section taken along the line 7—7 in FIG. 6.

DESCRIPTION OF THE PREFERRED EMBODIMENT

Referring to FIGS. 1 and 2, there is illustrated a clamp-type or clamping probe, generally designated by the numeral 10, constructed in accordance with and embodying the features of the present invention. The probe 10 is adapted to be clamped or clipped around an associated conductor 15 to measure the current flowing therethrough, in standard fashion, the probe 10 generating an electrical signal which is applied via a cord 17 to an associated meter or other indicating equipment.

Referring also to FIGS. 3-7, the probe 10 includes an upper jaw 20 and a lower jaw 70 which are interconnected intermediate the ends thereof for pivotal movement between open and closed conditions. The jaws 20 and 70 respectively have probe tips 30 and 80 shaped and dimensioned for cooperation to encircle the associated conductor 15 in the closed condition of the probe 10 to form a magnetic circuit around the conductor 15 to measure the current therethrough, all in standard fashion. It is a fundamental aspect of the present invention, that each of the upper and lower jaws 20 and 70 is of substantially unitary, one-piece construction so as to achieve advantageous features of the present invention.

The upper jaw 20 includes an elongated, generally channel-shaped jaw member or outer shell 21 which is of one-piece molded construction, and includes a pair of parallel, spaced-apart side walls 22 and 23 interconnected by a top wall 24 and closed at the rear end thereof by an end wall 25 in which is mounted a strain relief fitting 26 for the cord 17. Respectively integral with the side walls 22 and 23 intermediate their ends and depending therefrom are a pair of parallel pivot ears 27, respectively provided with aligned openings 28 therethrough. A friction grip surface 29 may be provided on the top wall 24 adjacent to the rear end of the jaw member 21.

The jaw member 21 is provided at the forward end thereof with the probe tip 30, which has a pair of opposed parallel side walls 31 which are respectively parallel with the side walls 22 and 23 and spaced a predetermined distance laterally inwardly therefrom, being connected thereto by inclined shoulders 32. The side walls 31 are closed at the forward end thereof by an end wall 33. The top wall 24 has a forward portion 24A which closes the side walls 31 at their upper ends. Integral with the top wall 24 and depending therefrom between the side walls 22 and 23, just behind the probe tip 30 is a retaining wall 34. Formed in the lower edges of the side walls 31 of the probe tip 30 are laterally aligned recesses 35.

Disposed in the probe tip 30 is a magnetic unit insert 40 which includes a magnetic core segment 41 which is generally L-shaped, having a horizontal leg 42 and a vertical leg 43. Molded to the core segment 41 is a spacer segment 44 which is generally cup-shaped, having a top wall 45 overlying the horizontal leg 42 of the core segment 41, a front end wall 46 which lies along the outer surface of the vertical leg 43, and a rear end wall 47 which lies along the rear end surface of the horizontal leg 42. The spacer segment 44 also includes a pair of side walls 48 (see FIG. 5) which respectively depend from the opposite side edges of the top wall 45 and interconnect the front and rear walls 46 and 47.

The magnetic unit insert 40 also includes a generally cup-shaped magnetic shield segment 50 which covers the outer surfaces of the spacer segment 44. More specifically, the shield segment 50 includes a top wall 51, front and rear end walls 52 and 53 and opposed side walls 54, which respectively lie along the walls 46-47 of the spacer segment 44. The magnetic unit insert 40 is nested in the probe tip 30, against the top wall 24 and between the side walls 31 and between the end wall 33 and the retaining wall 34, in intimate contact therewith.

The upper jaw 20 also includes an inner segment 55 which is disposed against the inner surfaces of the horizontal and vertical legs 42 and 43 of the core segment 41, substantially covering those surfaces except for the rearmost part of the inner surface of the horizontal leg 42. The inner segments 55 is provided with a recess surface 56 on its lower or outer side which is substantially congruent with the recesses 35 in the probe tip 30. Projecting from the rear end of the inner segment 55 is a stop lip 57, a slot 58 being formed in the inner segment 55 above the stop lip 57 to space the latter from the horizontal leg 42 of the core segment 41. A guide surface 59 is formed on the rear end of the inner segment 55 and intersects the stop lip 57 at an angle thereto, which is preferably very slightly greater than 90°.

As can be seen from FIGS. 4 and 5, the inner segment 55 cooperates with the spacer segment 44 to substantially completely encompass the magnetic core segment 41, except for an exposed surface portion 60 at the end of the vertical leg 43 and an exposed surface portion 61 on the underside of the horizontal leg 42 at the rear end thereof. Similarly, it can be seen that the spacer segment 44 cooperates with the probe tip 30 of the jaw member 21 to substantially encompass the shield segment 50, except for an exposed surface portion 62 on the front end wall 52 thereof and an exposed surface portion 63 on the rear end wall 53.

In assembly of the upper jaw 20, the core segment 41 and the spacer segment 44 are pre-molded together as a unit, which is then fitted into the shield segment 50 to form the magnetic unit insert 40. The jaw member 21 and inner segment 55 are then molded around the magnetic unit insert 40, so that the jaw member 21 and the inner segment 55 are unitary with each other and with the magnetic unit insert 40 to form an integral one-piece construction. A Hall effect sensor 65 may then be fitted into the slot 58 in the inner segment 55 and secured in place by a suitable adhesive, the sensor 65 being provided with electrical leads 66 which are, in turn, connected to the cord 17. The sensor 65 extends all the way to the rear edge of the horizontal leg 42 of the magnetic core segment 41 and beyond the rear edge of the stop lip 57.

The lower jaw 70 includes a molded one-piece, generally channel-shaped jaw member or outer shell 71, which includes a pair of spaced-apart parallel side walls 72 and 73, interconnected by a bottom wall 74 and closed by the rear end thereof by an end wall 75 (see FIG. 2). Preferably, the side walls 72 and 73 are respectively provided intermediate the ends thereof with a pair of laterally aligned openings (not shown) adapted for alignment with the openings 28 in the pivot ears 27 for receiving an associated pivot pin 76. The pin 76 pivotally interconnects the upper and lower jaws 20 and 70 for movement between a closed condition, illustrated in FIGS. 1 and 3, and an open condition (not shown) wherein the probe tips 30 and 80 are spaced apart to permit entry of the conductor 15 therebetween. A helical compression spring 77 may be provided between the jaws 20 and 70 rearwardly of the pivot pin 76 for resiliently biasing the jaws to their closed condition. Two slots 78 may be formed in the bottom wall 74 (see FIGS. 2 and 7) for improving the quality of the casting. A friction grip surface 79 may be provided on the bottom wall 74 adjacent to the rear end thereof (FIGS. 1 and 2).

The forward end of the jaw member 71 forms the probe tip 80, which is of the same width as the probe tip 30 and includes a pair of spaced-apart parallel side walls 81 connected to the side walls 72 and 73 by inclined shoulders 82. The side walls 81 are closed at the forward end of the probe tip 80 by an end wall 83. The bottom wall 74 is continuous along the entire length of the jaw member 71, including the probe tip 80. Integral with the bottom wall 74 just rearwardly of the probe tip 80 and projecting upwardly therefrom between the side walls 72 and 73 is a retaining wall 84. Formed in the upper edges of the side walls 81 are laterally aligned recesses 85.

It will be appreciated that the probe tip 80 defines a cup-shaped receptacle in which is mounted a magnetic unit insert 90, similar to the magnetic unit insert 40. The magnetic unit insert 90 includes a magnetic core segment 91 which is generally U-shaped, including a horizontal leg 92, a rear vertical leg 93 and a front vertical leg 93a which is substantially shorter than the rear leg 93. Formed along the outer surfaces of the core segment 91 is a spacer segment 94 which includes a bottom wall 95, front and rear end walls 96 and 97 and a pair of opposed side walls 98, all cooperating to define a generally cup-shaped housing fitted around the core segment 91 (see FIGS. 6 and 7).

Fitted around the spacer segment 94 is a magnetic shield segment 100, which includes a bottom wall 101, front and rear end walls 102 and 103 and a pair of opposed side walls 104. Lying along the inner surfaces of the core segment 91 is an inner segment 105 having an upper surface 106 which is shaped to be complementary to the recess surface 56 of the inner segment 55 on the upper jaw 20, as will be explained more fully below. Provided on the upper surface of the inner segment 105 is a horizontal ledge 107, which is integral at its rear end with an upwardly extending guide surface 108, disposed at an angle preferably very slightly greater than 90° with respect to the ledge 107. The guide surface 108 terminates at a horizontal end surface 109.

It can be seen that the inner segment 105 cooperates with the spacer segment 94 to substantially encompass the core segment 91, except for an exposed surface portion 110 on the vertical leg 93a, and an exposed surface portion 111 at the end of the vertical leg 93. Similarly, the spacer segment 94 cooperates with the jaw member 71 to substantially encompass the shield segment 100, except for an exposed surface portion 112 at the end of the front end wall 102 and an exposed surface portion 113 at the upper end of the rear end wall 103.

In assembly of the lower jaw 70, the core segment 91 is pre-molded together with the spacer segment 94, and this unitary body is then fitted into the shield segment 100 to form the magnetic unit insert 90. The outer shell 71 and the inner segment 105 are then molded around the magnetic unit insert 90, with the outer shell 71 and the inner segment 105 being unitary with each other and with the magnetic unit insert 90 to form a one-piece construction.

The parts are so dimensioned an arranged that the upper jaw 20 defines horizontal surfaces which are made to fit flush against complementary horizontal surfaces on the lower jaw 70. In particular, it will be noted that the exposed surface portions 60 and 110 on the core segments 41 and 91 are made to fit flush against each other when the jaws 20 and 70 are closed, so that the core segments 41 and 91 cooperate to form a magnetic loop encircling the associated conductor 15. The parts are arranged so that when the jaws 20 and 70 are closed, the exposed surface portion 111 on the core segment 91 is spaced a slight distance from the Hall effect sensor 65, providing an air gap 114 in the magnetic circuit. This gap is ensured by engagement of the ledge 107 against the bottom surface of the inner segment 55, and engagement of the end surface 109 with the stop lip 57. Furthermore, it will be noted that as the jaws close, the guide surfaces 59 and 108 slide along one another in mating engagement to guide the movement of the jaws to their closed condition, ensuring that the respective parts of the two jaws 20 and 70 will move precisely into proper alignment.

It will further be noted that the exposed surface portions 62 and 112 on the shield segments 50 and 100 are made to fit flush against each other, as are the exposed surface portions 63 and 113 thereof, when the jaws are closed. As can best be seen in FIG. 3, there is a notch formed through the retaining wall 34 and the rear end wall 53 of the shield segment 50 to accommodate passage of the sensor leads 66. But except for this notch, the shield segments 50 and 100 cooperate effectively to form a closed magnetic circuit encircling the inner core of the loop to provide an effective magnetic shield to prevent spurious magnetic signals from affecting the magnetic circuit formed by the magnetic core segments 41 and 91.

In a constructional model of the present invention, the core segments 41 and 91 are formed of a suitable magnetic alloy, such as a silicon steel alloy like that sold under the trademark SILECTRON by Magnetics & Electronics, Inc. The magnetic shield segments 50 and 100 are also formed of a suitable magnetically permeable material, such as a magnetic alloy of the type sold under the trademark CO-NETIC AA alloy by Magnetic Shield Division, Perfection Mica Company. The remaining portions of the probe 10, i.e., the jaw members 21 and 71, the spacer segments 44 and 94 and the inner segments 55 and 105 are all molded of a suitable magnetically impermeable material, such as a nylon resin like that sold under the trademark ZYTEL by E.I. DuPont de Nemours & Co., Inc.

Because of the unitary one-piece construction of each of the jaws 20 and 70, the parts will retain their as-manufactured dimensions and will permit accurately repeatable movement to a precise closed condition which will maintain the magnetic core and shield paths in predetermined conditions, this movement also being facilitated by the guide surfaces 59 and 108. Thus, after an initial calibration of the probe 10, further calibrations should normally be unnecessary. Furthermore, the probe 10 will be highly resistant to misalignment of the parts as a result of dropping the probe 10 or other mechanical shocks thereto, vibration thereof or the like.

From the foregoing, it can be seen that there has been provided a improved ammeter probe which is of simple and economical construction, yet which affords precisely repeatable movements to a predetermined measuring condition with only a single initial calibration of the device.

We claim:

1. A clamping ammeter probe comprising: two opposed jaws interconnected for pivotal movement between open and closed conditions, each of said jaws including a magnetic core unit disposed between substantially magnetically impermeable inner and outer segments and unitary with each, each of said magnetic core units including a magnetic core segment and a magnetic shield segment and a substantially magnetically impermeable intermediate segment therebetween and unitary with said core segment, in each of said jaws said intermediate segment cooperating with said inner segment to substantially encompass said magnetic core segment except for two spaced-apart exposed surface portions thereof, in each of said jaws said intermediate segment cooperating with said outer segment to substantially encompass said magnetic shield segment except for two spaced-apart exposed surface portions thereof, said magnetic core segments cooperating when said jaws are disposed in the closed condition thereof to form a magnetic core path for encircling an associated conductor with the exposed surface portion of one core segment disposed in facing relationship respectively with the exposed surface portions of the other core segment, said shield segments cooperating when said jaws are disposed in the closed condition thereof to form a magnetic shield path for substantially encompassing said magnetic core path with the exposed surface portions of one of said shield segments being respectively disposed in facing relationship with the exposed surface portions of the other of said shield segments.

2. The probe of claim 1, wherein said substantially magnetically impermeable segments include nylon material and said core segments include a magnetic alloy.

3. The probe of claim 1, wherein said magnetic path is generally in the shape of a rectangular loop.

4. The probe of claim 1, wherein each of said outer segments is generally of concave shape.

5. The probe of claim 1, and further comprising a magnetic sensor coupled to said magnetic core path.

6. The probe of claim 5, wherein one of said inner segments has a recess formed therein, said magnetic sensor being received in said recess and having a sensing portion disposed between facing exposed surface portions of said magnetic core segments.

7. The probe of claim 6, and further comprising stop means formed on said inner segments for engagement with each other when said jaws are disposed in the closed condition thereof to prevent one of said core segments from contacting said sensor.

8. The probe of claim 1, and further comprising guide surfaces formed in said inner segments for cooperation to guide the movement of said jaws to the closed condition thereof to ensure accurately repeatable formation of said magnetic core path and said magnetic shield path.

9. A clamping ammeter probe comprising: two opposed jaws interconnected for pivotal movement between open and closed conditions, each of said jaws including a substantially magnetically impermeable outer shell open along one side thereof with the open sides of said shells facing each other, two magnetic core units respectively received in said outer shells and unitary therewith, each of said magnetic core units including a magnetic core segment and a magnetic shield segment and a substantially magnetically impermeable intermediate segment therebetween and unitary with said core segment, and two substantially magnetically impermeable inner segments respectively unitary with said core segments and said outer shells, each of said intermediate segments cooperating with its corresponding outer shell and inner segment to substantially encompass the corresponding magnetic core segment and magnetic shield segment except for spaced-apart exposed end surfaces thereof, said magnetic core segments cooperating when said jaws are disposed in the closed condition thereof to form a magnetic core path for encircling an associated conductor with the exposed surface portions of one core segment disposed in facing relationship respectively with the exposed surface portions of the other core segment, said shield segments cooperating when said jaws are disposed in the closed condition thereof to form a magnetic shield path for substantially encompassing said magnetic core path with the exposed surface portions of one of said shield segments being respectively disposed in facing relationship with the exposed surface portions of the other of said shield segments.

10. The probe of claim 9, wherein said magnetic path is generally in the shape of a rectangular loop.

11. The probe of claim 9, wherein each of said shield segments is generally channel-shaped in transverse cross sections.

12. The probe of claim 9, wherein each of said jaws has the magnetic core unit thereof molded to the outer shell and the inner segment thereof in a unitary one-piece construction.

13. The probe of claim 9, wherein the facing exposed surface portions of said shield segments are disposed in contact with each other when said jaws are disposed in the closed condition thereof.

14. The probe of claim 9, wherein the facing exposed surface portions of said core segments at one end thereof are disposed in contact with each other, while the facing exposed surface portions of said core segments at the other end thereof are spaced apart when said jaws are disposed in the closed condition thereof.

* * * * *